(12) United States Patent
James (10) Patent No.: US 7,446,509 B2
(45) Date of Patent: Nov. 4, 2008

(54) INTELLIGENT BATTERY CHARGING SYSTEM

(75) Inventor: John E. James, Redlands, CA (US)

(73) Assignee: Gem Power, LLC, Redlands, CA (US)

( * ) Notice: Subject to any disclaimer, the term of this patent is extended or adjusted under 35 U.S.C. 154(b) by 448 days.

(21) Appl. No.: 11/101,049

(22) Filed: Apr. 6, 2005

(65) Prior Publication Data

US 2005/0248314 A1     Nov. 10, 2005

Related U.S. Application Data

(60) Provisional application No. 60/569,394, filed on May 8, 2004.

(51) Int. Cl.
     *H02J 7/16*       (2006.01)
(52) U.S. Cl. ...................... 320/156; 320/161
(58) Field of Classification Search ................ 320/156, 320/165, 161, 148, 157, 162
See application file for complete search history.

(56) References Cited

U.S. PATENT DOCUMENTS

| | | | |
|---|---|---|---|
| 3,597,673 A | 8/1971 | Burkett et al. | |
| 4,829,225 A * | 5/1989 | Podrazhansky et al. | ..... 320/129 |
| 5,307,000 A | 4/1994 | Podrazhansky et al. | |
| 5,694,023 A | 12/1997 | Podrazhansky et al. | |
| 5,729,115 A | 3/1998 | Wakefield | |
| 6,043,631 A * | 3/2000 | Tsenter | ....................... 320/148 |
| 6,411,098 B1 * | 6/2002 | Laletin | ....................... 324/436 |
| 2003/0015993 A1 | 1/2003 | Misra et al. | |

* cited by examiner

*Primary Examiner*—Adolf Berhane
*Assistant Examiner*—Aaron Piggush
(74) *Attorney, Agent, or Firm*—Patent Venture Group; Joe A. Brock, II (57) ABSTRACT

An invention is provided for detecting polarization in a battery during battery charging. The invention includes applying a waveform to a battery, and obtaining a plurality of battery response voltage readings corresponding to points along the applied waveform. A battery response voltage curve is calculated based on the voltage differences between the plurality of battery response voltage readings. A battery polarization point is then identified when the slope of the battery response voltage curve stops increasing at an increasing rate. To enhance accuracy, a plurality of battery response voltage curves can be calculated, each based on voltage differences between battery response voltage readings taken along the waveform. The battery polarization point can then be identified when the slopes of all the battery response voltage curves stop increasing at an increasing rate.

7 Claims, 11 Drawing Sheets

INTELLIGENT BATTERY CHARGING SYSTEM

CROSS REFERENCE TO RELATED APPLICATIONS

This application claims the benefit of U.S. Provisional Patent Application having Ser. No. 60/569,394, filed on May 8, 2004, entitled "Intelligent Battery Charger," which is hereby incorporated by reference.

STATEMENT REGARDING FEDERALLY SPONSORED RESEARCH OR DEVELOPMENT

Development of the present invention was funded under Navy contracts N00 421-02-C-3164 and N00 421-03-C-0063 and is a "subject invention" thereunder.

BACKGROUND OF THE INVENTION

1. Field of the Invention

This invention relates generally to storage battery charging systems and, more particularly, to a method and apparatus for the charging of a battery wherein provision of the correct charging voltage is based on information received from the battery during the charging process for any given cycle and battery.

2. Description of the Related Art

A rechargeable battery requires periodic recharging during its useful life. Various methods are known for rapid charging of storage batteries, including means for terminating the charging process, but overcharging of the battery is a frequent result. Overcharging irreversibly consumes the negative electrode of lead acid batteries, thereby reducing its volume and resulting storage capacity. There are many different types, sizes and capacities of batteries. Each type, size and/or capacity of rechargeable batteries may require a different charging algorithm. The battery manufacturer may determine the appropriate charging algorithm, which can be implemented with a battery charger. A typical battery charger may comprise a microcontroller, a power interrupt controller, a power converter circuit, and a feedback circuit for the battery voltage and/or current (depending on battery type and design requirements).

By way of example, U.S. Pat. No. 3,597,673, Burkett et al —08/1971 is directed to a means of reducing time required to recharge a battery by applying a depolarizing/discharging pulse between charging pulses; U.S. Pat. No. 4,829,225, to Podrazhansky et al, 05/1989, discloses that a further reduction in charging time can be achieved by waiting for a specified period after the end of the discharge pulse before applying the next charging pulse; U.S. Pat. No. 5,307,000 to Podrazhansky et al, 04/1994, discloses method and apparatus for rapidly charging a battery by applying at least one charging pulse to the battery, applying a plurality of depolarizing pulses to the battery, the pulses being separated by wait periods, and repeating the charge and discharge procedure until the battery is completely charged.

U.S. Pat. No. 5,694,023, to Podrazhansky et al, 12/1997, relates to method and apparatus for rapid charging of a battery wherein, in sequence, a first charging pulse is followed by a depolarizing pulse; a first rest period during which a voltage is measured at a predetermined point therein; a second depolarizing pulse is applied; a second rest period during which a voltage is measured at the predetermined point therein; the difference between the voltages is measured; and the average charging current is decreased if the difference is greater than a predetermined amount. The average charging and depolarizing currents may be decreased by selectively changing pulse duration pulse amplitude or the pulse repetition rate, or any combination thereof; U.S. Pat. No. 5,729,115 to Wakefield, 03/1998 relates to apparatus for charging batteries of different types having a sensor connected to a circuit for identifying the particular type of received battery by voltage indicative of a particular battery type and supplying a charging current to the received battery in accordance with a specified charging algorithm applicable to the particular battery type.

US Patent Application Publication No. U.S. 2003/0015993 A1, published Jan. 23, 2003 relates to a battery charging system providing controlled charging in accordance with an algorithm utilizing historical battery data acquired while the battery is in service and during previous charge cycles. The historical battery data is stored in the memory of a battery management module and is used to provide parameters to a charging algorithm.

In view of the foregoing, there is a need for a real-time means for accurately determining the type of battery and the state of its charge during a rapid charging process, so that the process may be optimized to bring the battery to a fully charged position and the charging process promptly terminated thereafter.

SUMMARY OF THE INVENTION

Broadly speaking, embodiments of the present invention allow the battery itself to determine how it should be charged. By analyzing relationships between battery response voltages, embodiments of the present invention determine when the battery has become polarized and thus no longer needing charging. In one embodiment, a method for detecting polarization in a battery is disclosed. The method includes applying a waveform to a battery, and obtaining a plurality of battery response voltage readings corresponding to points along the applied waveform. A battery response voltage curve is calculated based on the voltage differences between the plurality of battery response voltage readings. A battery polarization point is then identified when the slope of the battery response voltage curve stops increasing at an increasing rate. Each data point along the battery response voltage curve can be calculated by selecting a first battery response voltage reading and a second battery response voltage reading each taken along the waveform, and then calculating the difference between the battery response voltage readings.

To enhance accuracy, a plurality of battery response voltage curves can be calculated, each based on voltage differences between battery response voltage readings taken along the waveform. The battery polarization point can then be identified when the slopes of all the battery response voltage curves stop increasing at an increasing rate. In this manner, the charging of the battery can be divided into three stages, a fast charge operation, followed by a normal charge operation, which is followed by a pre end-of-charge operation, all of which are terminated based on the above process.

An additional method for detecting polarization in a battery is disclosed in a further embodiment of the present invention. The method includes applying a waveform to a battery, and calculating a battery response voltage curve based on the voltage differences between battery response voltage readings corresponding to points along the waveform. Next, a first Gaussian filter and a second Gaussian filter are applied to data of the battery response voltage curve. Here, the second Gaussian filter averages a greater number of data points than the first Gaussian filter. A trigger peak curve is then calculated by on subtracting the results of a first Gaussian filter from the results of a second Gaussian filter, and the battery polarization point is identified when a maximum peak occurs in the trigger peak curve.

Similar to above, enhanced accuracy can be achieved by calculating a plurality of battery response voltage curves based on voltage differences between battery response voltage readings taken along the waveform, and applying the first and second Gaussian filters to each battery response voltage curve. In this case, a plurality of trigger peak curves are calculated, each based on subtracting results of the first Gaussian filter from results of the second Gaussian filter applied to corresponding battery response voltage curves. When a maximum peak occurs in each trigger peak curve of the plurality of trigger peak curves, the battery polarization point is identified.

A system for charging a battery is disclosed in yet a further embodiment of the present invention. The system includes a switching circuit capable of applying a waveform to a battery. The switching circuit is coupled to a power source and a battery load. Also coupled to the switching circuit is a battery management module. The battery management module includes logic that obtains a plurality of battery response voltage readings corresponding to points along the waveform. The battery management module also includes logic that calculates a battery response voltage curve based on the voltage differences between the plurality of battery response voltage readings. Logic is further included that initiates termination of application of the waveform when a slope of the battery response voltage curve stops increasing at an increasing rate, which indicates a battery polarization point has occurred. Similar to above, the battery management module can enhance accuracy by including logic that calculates a plurality of battery response voltage curves based on voltage differences between battery response voltage readings taken along the waveform, and initiates termination of application of the waveform when slopes of all the battery response curves stop increasing at an increasing rate.

A typical waveform may include an initial rest period, followed by a first charging pulse, followed by a first rest period, followed by a first depolarization pulse, followed by a second rest period, followed by a second charging pulse, followed by a third rest period, followed by a second depolarization pulse. Also similar to above, the battery management module can conduct a fast charge operation followed by normal charge operation, followed by a pre end-of-charge operation. In this aspect, the battery management module terminates each of the fast charge operation, normal charge operation, and pre end-of-charge operation when in each operation a slope of a battery response voltage curve stops increasing at an increasing rate.

As can be seen from the above brief summary, it is an object of the present invention to provide a real-time means for accurately determining the type of battery and the state of its charge during a rapid charging process, so that the process may be optimized to bring the battery to a fully charged position and the charging process promptly terminated thereafter.

An additional object of this invention is to provide an improved battery charger providing the correct charging voltage based upon information received from the battery during the charging process for any given cycle or battery.

Another object of this invention to provide a rapid battery charging system wherein the status of the battery charge controls the output of the charging means.

And yet another object is to provide a battery charging system wherein the charging rate and the cut-off voltages are dynamically determined by intermittent sampling of the status of the battery being charged.

A still further object of the present invention is to provide a method and means of rapid charging of batteries wherein the parameters of the charging current are governed by real-time data collection and analysis of the battery state of charge. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for an intelligent battery charging system that allows the battery itself to determine how it should be charged. By analyzing relationships between battery response voltages, embodiments of the present invention determine when the battery has become polarized and thus no longer needing charging. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
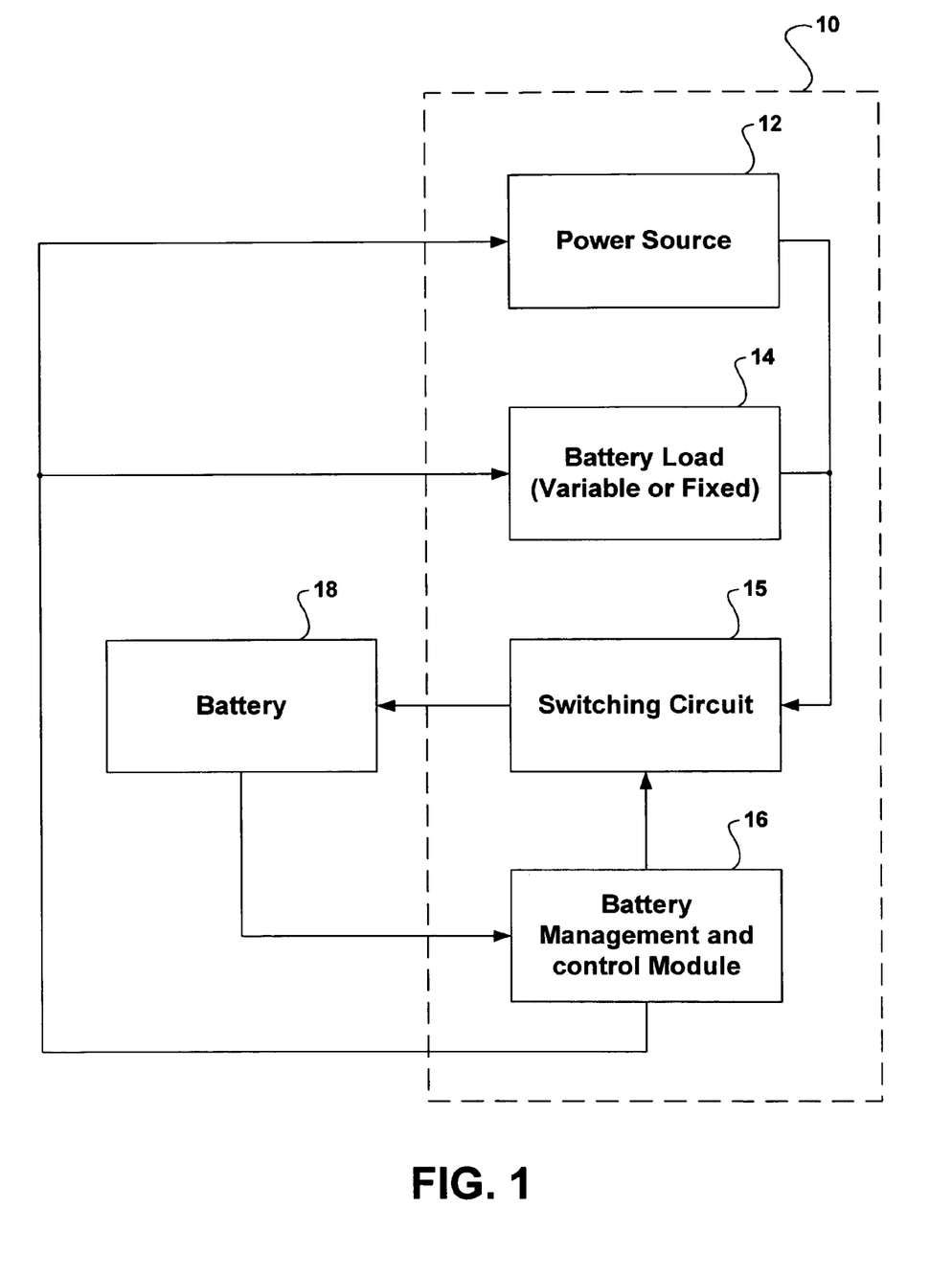
FIG. 1 is a functional block diagram of the battery charging system as employed in an exemplary embodiment of the invention.

Turning now to the drawings, FIG. 1 is a block diagram of a battery charging and discharging circuit 10 in accordance with an embodiment of the present invention. The battery charging and discharging circuit 10 of the present invention comprises a power source 12, a variable or fixed battery load 14, a switching circuit 15, and a battery management and control module 16 having timing and control with a Program Interrupt Controller (PIC), and/or a microcontroller and/or microprocessor and associated circuitry. The power source 12 is connected to the switching circuit 15 and the battery load 14, which may be for example, a variable load bank. The output of the switching circuit 15 is connected to the battery 18 to be charged, and the output of the battery 18 is connected to the battery management and control module 16, which in turn, is connected to the switching circuit 15.

As will be described in greater detail below, the battery management and control module 16 includes logic that obtains a plurality of battery response voltage readings resulting from a waveform applied to the battery 18 via the switching circuit 15. The battery management and control module 16 also calculates a battery response voltage curve based on voltage differences between the battery response voltage readings. When the slope of the battery response voltage curve stops increasing at an increasing rate, the battery management and control module 16 initiates termination of the waveform by sending a signal to the switching circuit 15. In general, accuracy is increased by calculating a plurality of battery response voltage curves based on voltage differences between battery response voltage readings taken along the waveform, and terminating the waveform when slopes of all the battery response curves stop increasing at an increasing rate.

Figure 2:
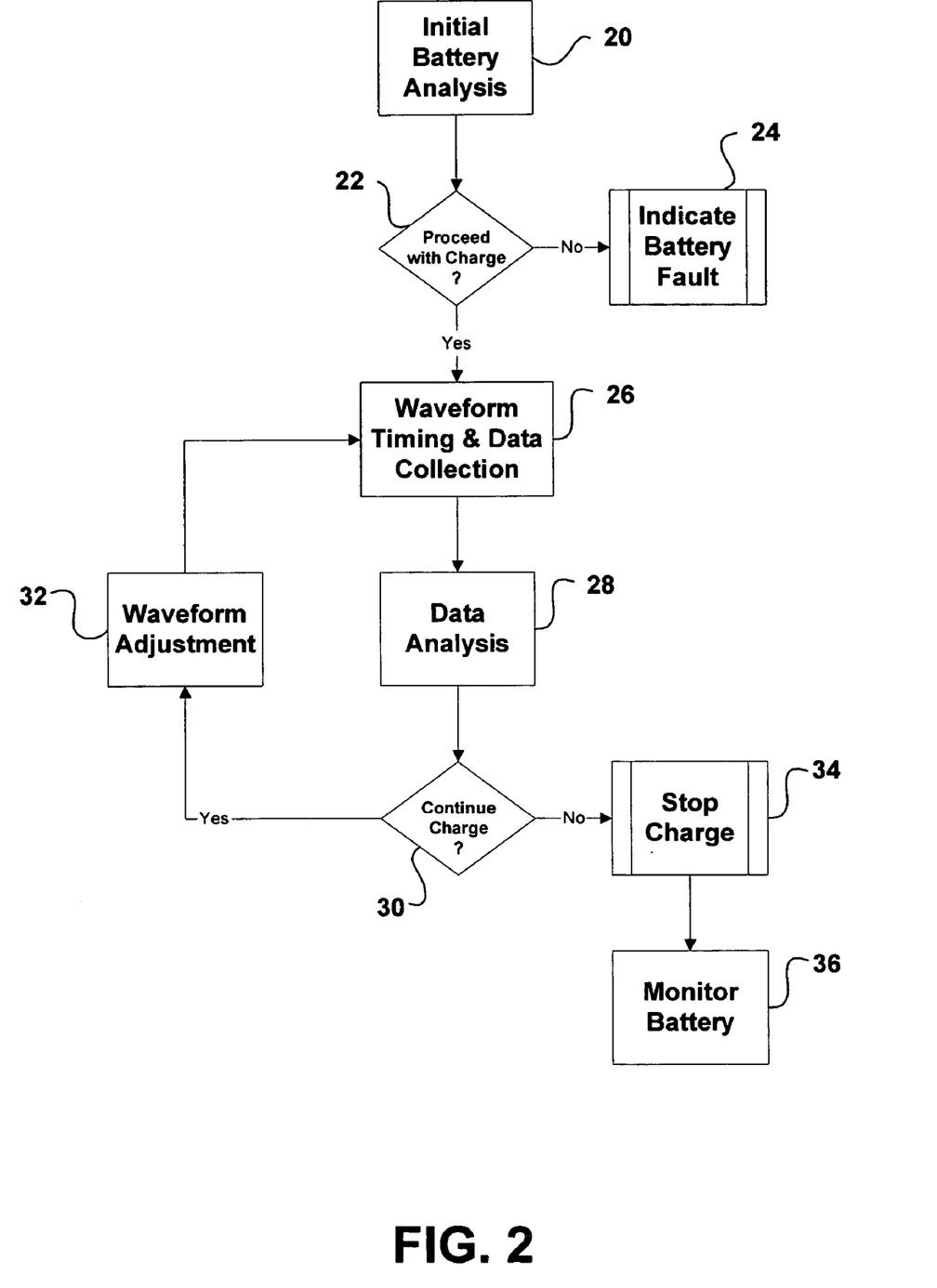
FIG. 2 is a flow diagram showing an overview of an exemplary battery charging process in accordance with the present invention.

FIG. 2 is a flow diagram showing an overview of a battery charging process in accordance with an embodiment of the present invention. At step 20 a check is made for the proper battery connection. A determination is made, at step 22, as to whether to proceed with the charging process. If there is indication of a battery fault, step 24, the charge will not proceed. Charging does not start until a proper battery connection is made and, if so, waveform timing and data collection step 26 and data analysis, step 28, will proceed in the manner to be explained in detail hereinafter.

Briefly, the battery is sized, based upon the measured voltage drop under increasing load of specified increments, the level of the initial charging and depolarizing pulses are set, and a charge/depolarizing sequence initiated for a predetermined time period. A check of key relationships occurring at the end of the charge and a check for key characteristics of battery types are made step 36. A charge, without depolarization, intended to give the battery a quick boost for determination of the subsequent depolarization and charging pulses, is initiated. Analysis determines the values of these pulses to be used for the main charge mode, and at step 32 the waveforms adjusted accordingly.

The main charge sequence continues, at a high rate, based on the charging pulse, with the level of the depolarizing increased proportionately to coincide with the increased charging pulse. Subsequent data collection and data analysis, based upon derivatives of the key relationships, mandates termination of the charge sequence, step 30, and the charge is stopped, at step 34.

Figure 3:
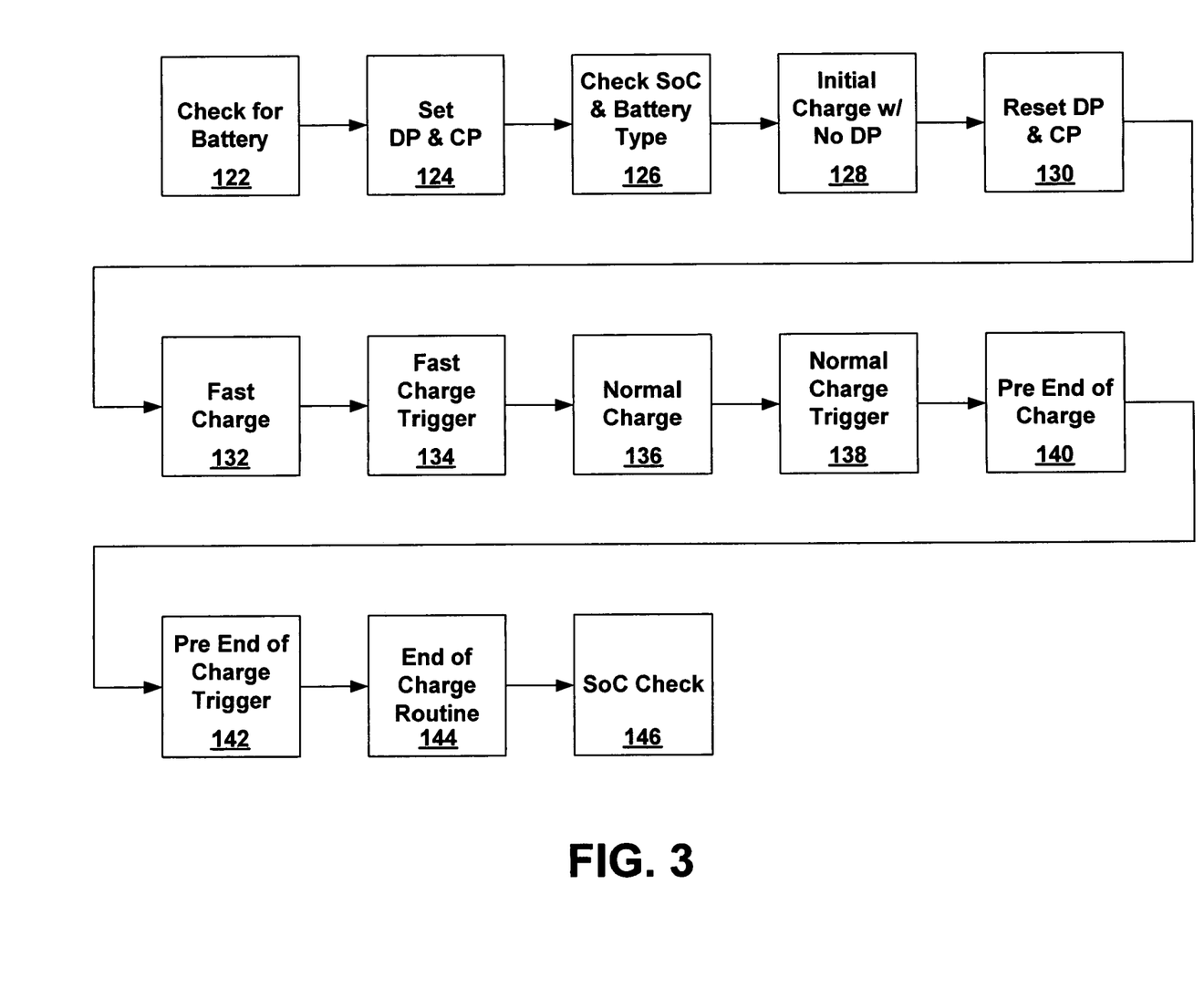
FIG. 3 is an algorithm flow chart illustrating the various states of the exemplary battery charging process in accordance with the present invention.

FIG. 3 is an algorithm flow chart illustrating the various states of an exemplary battery charging system in accordance with an embodiment of the present invention. As shown in FIG. 1, the battery to be charged 18 is connected to the charging system 10 and a check for proper connection made shown in FIG. 3 as step 122. Upon determination that a proper connection has been made, the battery 18 is generally sized by measuring the voltage drop under increasing load, step 124, thereby setting the level of charging pulses (CP) and depolarizing pulses (DP) to be generated thereafter. The battery is sized based upon the voltage drop under increasing load increments and the level of the depolarizing and charging pulses is set in a manner independent of preset battery voltages.

At subsequent step 126, the state-of-charge and battery type are determined by providing a short duration charge at a determined amplitude of charging pulse (CP) and depolarizing pulse (DP). A simple check is also made of key relationships occurring at the end of the charge by waveform and data collected from channels 1 and 2, 3 and 5, 6 and 7 (See FIG. 5). Another check is made by the sampling of waveforms and data collected from channels 6 and 7 (See FIG. 5) to determine the presence or absence of key characteristics of battery types (e.g. Nickel Cadmium ($N_iC_d$) batteries). By way of example, at step 126 a check is made for state of charge (SoC) and battery type. In the present embodiment, SoC is determined by looking at the relationships of several channels. At step 128, an initial charge pulse, without the application of a depolarizing pulse, is applied to the battery to provide a "quick boost" for redetermination of the depolarizing and charging pulse values.

The values of the depolarizing and charging pulses to be used for the main charge mode are reset at step 130. The main charge sequence is commenced, step 132, at a high rate based upon the value of the charging pulse, the depolarizing pulse level generally being increased proportionately to coincide with the increased fast charge pulse. The fast charge continues to be monitored via data collection channels, the fast charge being terminated when the fast charge trigger waveform reaches a peak value, step 134, the depolarizing and charge levels being reset to normal, and the trigger values reset, step 136. The charging cycle is subsequently terminated based upon analysis of the derivative waveforms of Channels 1, 2, 3, and 5 monitored by said data collection channels at step 138. A Pre End of Charge is commenced at step 140, which ends during the Pre End of Charge Trigger step 142. Thereafter, the voltage level is set for the end-of-charge routine step 144. The end-of-charge routine provides a finishing charge, reducing the charging rate over several iterations while keeping the depolarization charge value at normal level, terminating the charging process when the battery is fully charged as indicated by the State of Charge (SoC) routine, Step 146.

Figure 4:
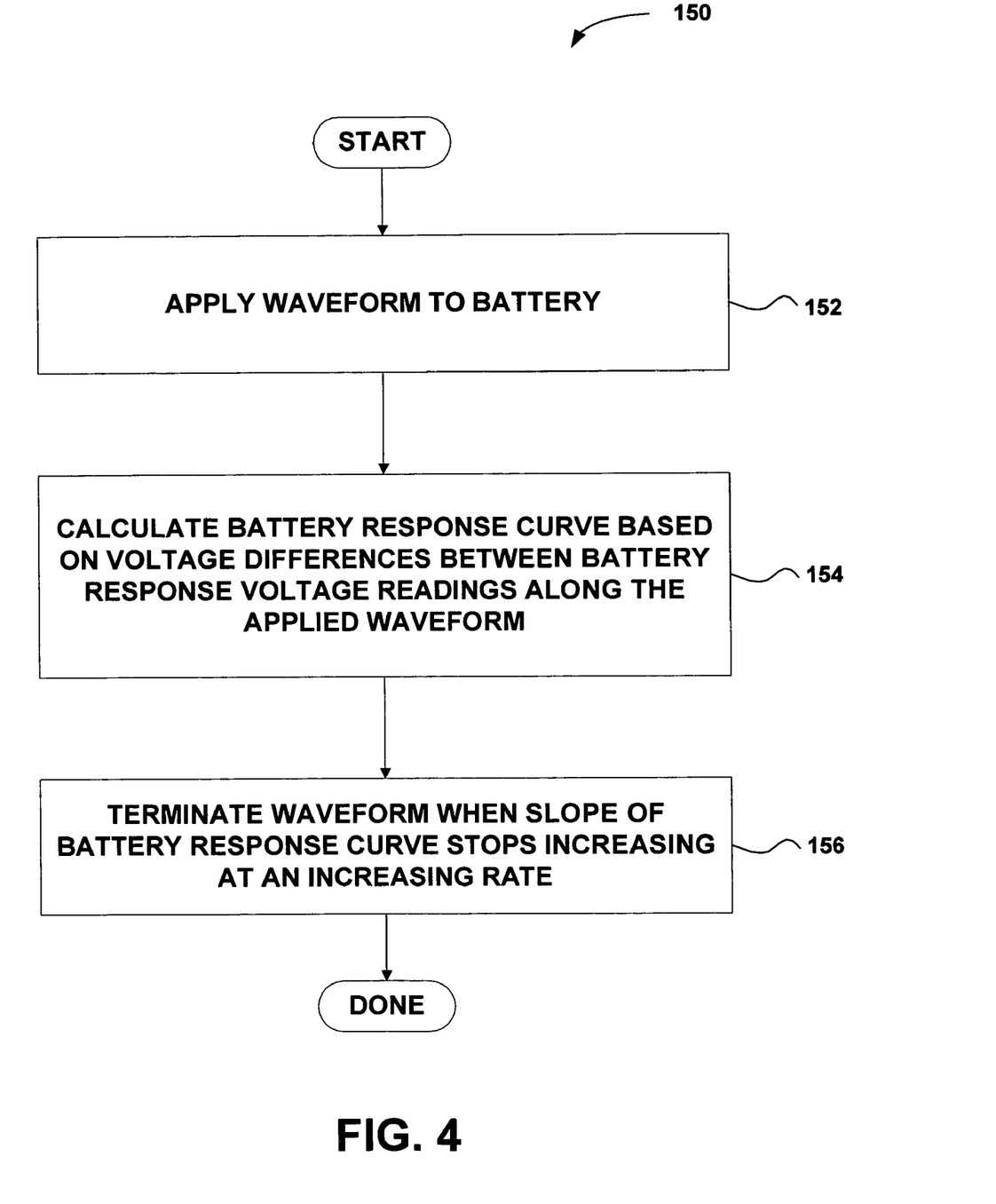
FIG. 4 is a flowchart showing a charging process and charge trigger analysis in accordance with an embodiment of the present invention.

As will be described in greater detail subsequently, embodiments of the present invention allow the battery itself to determine how it should be charged. By analyzing relationships between battery response voltages, embodiments of the present invention determine when the battery has become polarized and thus no longer needing charging. FIG. 4 is a flowchart showing a charging process 150 and charge trigger analysis in accordance with an embodiment of the present invention. The charging process 150 can be utilized during the fast charge 132 and fast trigger 134 operations, the normal charge 136 and normal trigger 138 operations, and the pre end of charge 140 and pre end of charge trigger 142 operations.

Figure 5:
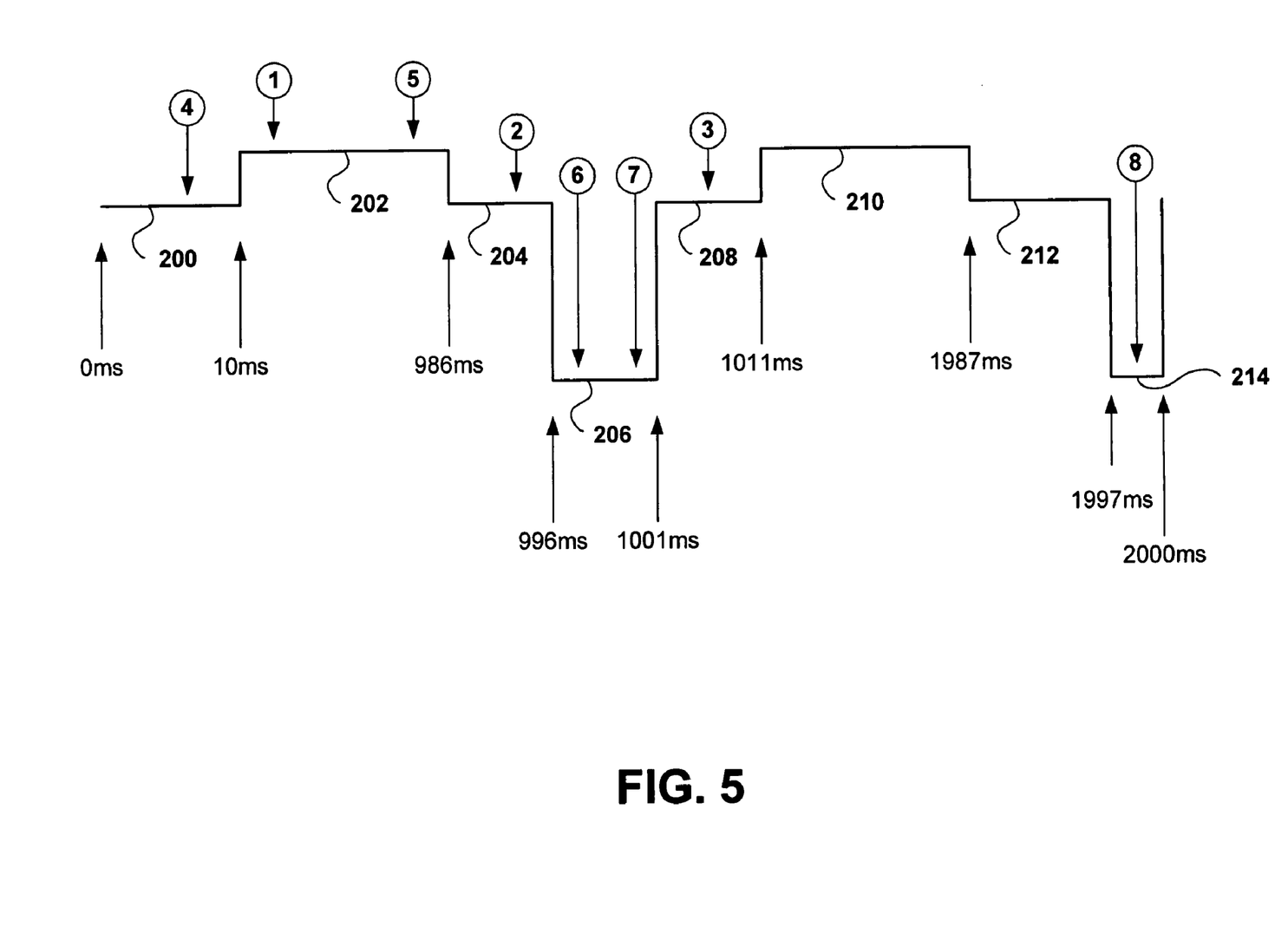
FIG. 5 shows the waveform which illustrates the battery charging process and how the state of charge of the battery is determined by comparing voltage measurements taken at different time intervals during charging and rest periods.

In operation 152, a waveform is applied to the battery. An exemplary waveform is illustrated in FIG. 5 wherein an initial rest period 200 (shown here as 10 milliseconds) is followed by an initial charging pulse 202, a ten millisecond rest period 204, a depolarizing pulse 206, a 10 millisecond rest period 208, a charging pulse 210, a 10 millisecond rest period 212, and a depolarizing pulse 214, all over a period of two (2) seconds.

Next, in operation 154, a battery response curve is calculated based on the voltage differences between the battery response voltage readings at various channels along the applied waveform. Turning back to FIG. 5, the battery response voltage corresponding to various data points (1-8 in FIG. 5) along the waveform are measured. The battery response voltage corresponding to a data point is referred to as a "channel," hence FIG. 5 depicts eight (8) channels along the waveform.

The battery response voltage readings are collected by the battery management and control module 16 at designated intervals and analyzed, and repeated depending upon the results of the analysis, i.e., in accordance with the response of the battery 18, to sizing pulses 202, 210 and depolarizing pulses 206, 214. While the present embodiment of the invention employs variations of charging voltage amplitude, it is within the scope of the present invention to employ variations of duration of pulses of constant voltage amplitude.

Figure 6:
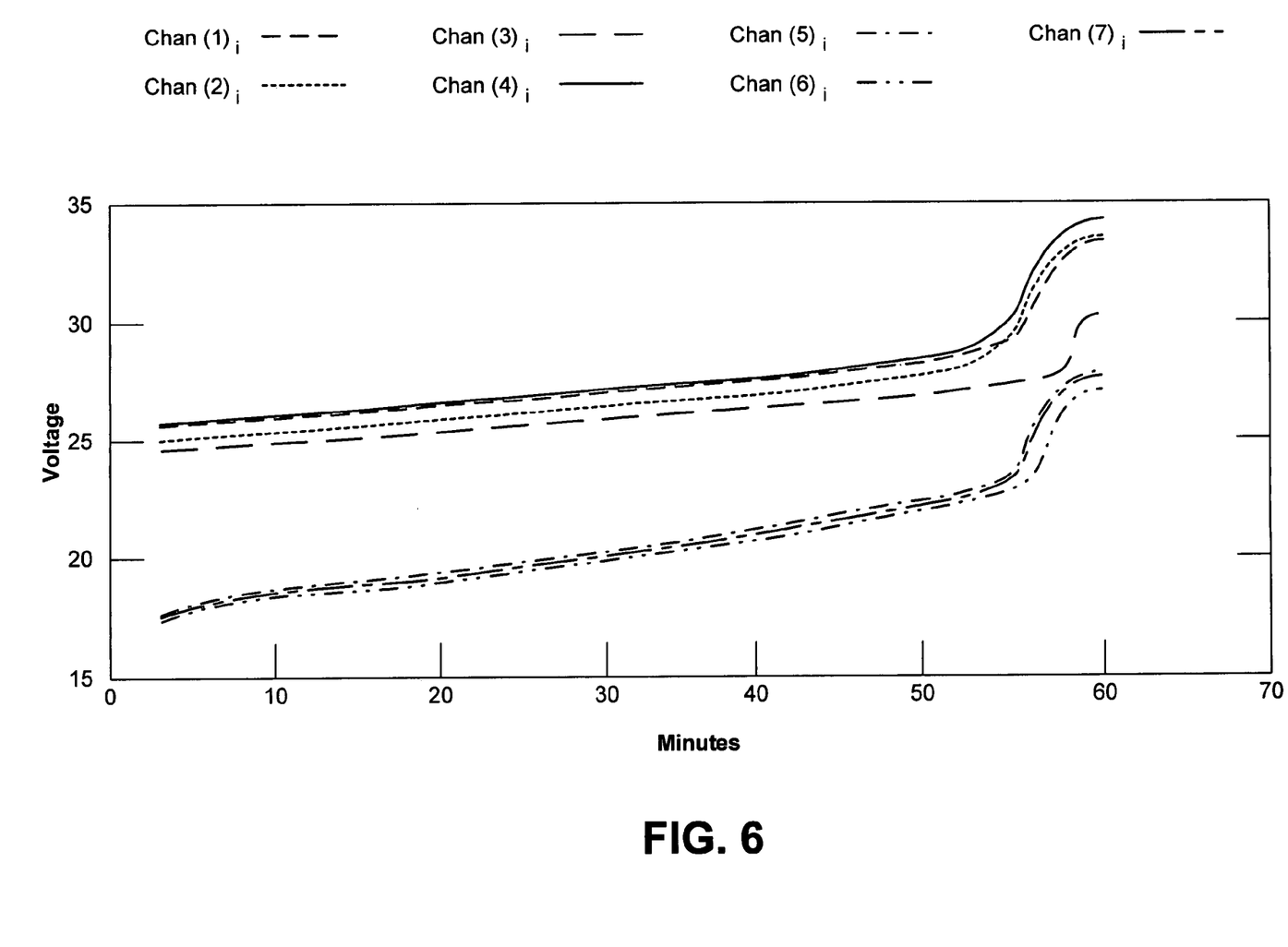
FIG. 6 illustrates typical charge data taken over eighteen hundred sequences.

FIG. 6 illustrates typical charge data taken over eighteen hundred sequences. Each channel 1-7 curve of FIG. 6 illustrates the battery response voltage readings corresponding to the point on the waveform of FIG. 5 having the same number designation as the channel. For example, the measured voltage across the battery 18 after imposition of the charging pulse 202, which corresponds to point 2, is referred to as channel (2), and the measured voltage across the battery 18 after imposition of the depolarizing pulse 206, which corresponds to point 3, is referred to as channel (3). Similarly, the measured voltage across the battery 18 at the beginning of the charge pulse 206, which corresponds to point 1, is referred to as channel (1), and the measured voltage across the battery 18 at the end of the charge pulse 206, which corresponds to point 5, is referred to as channel (5).

Figure 7:
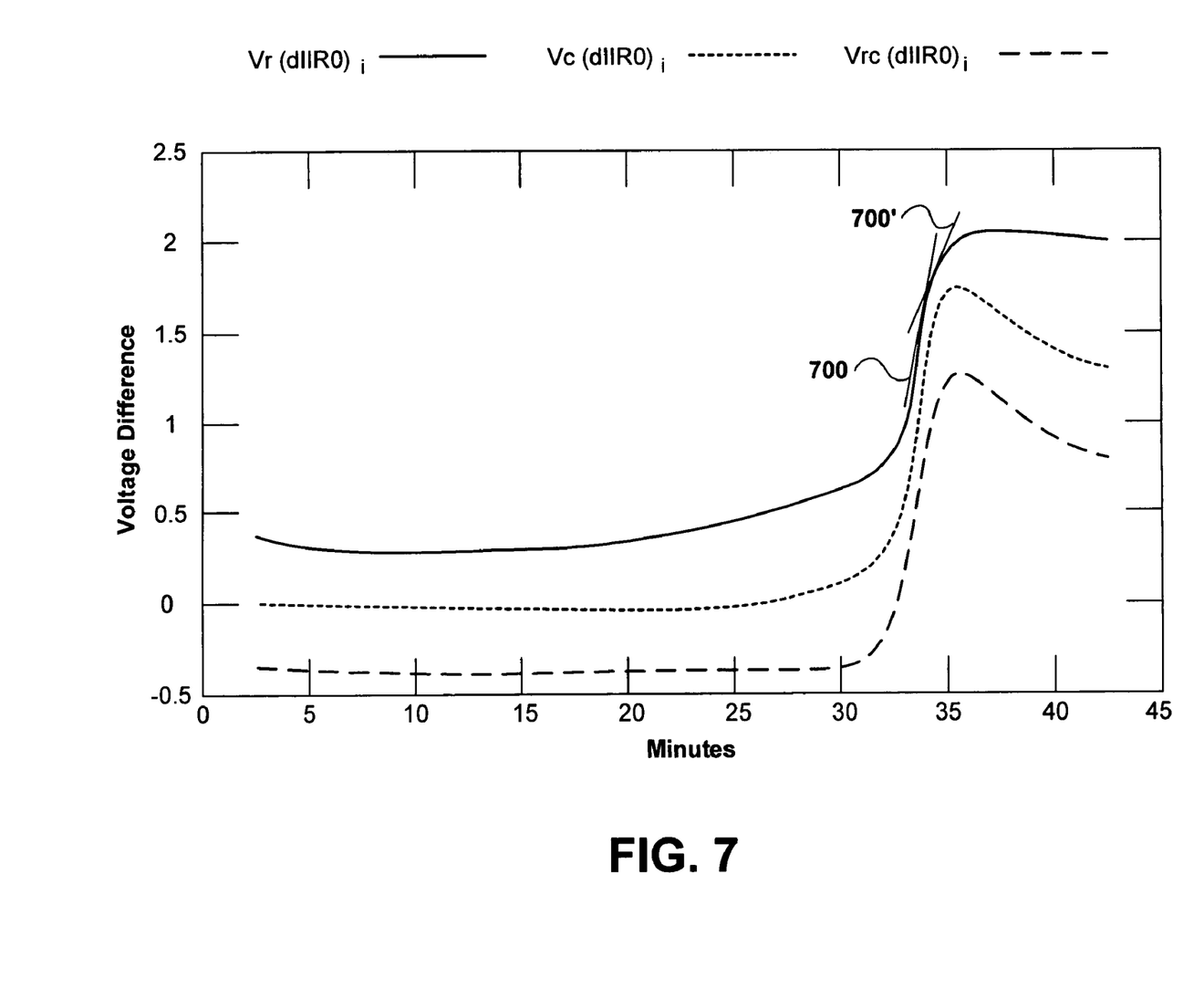
FIG. 7 displays three difference battery response voltage curves, which are the charge voltage deltas between channels.

Embodiments of the present invention calculate the difference between response voltage readings along the applied waveform by subtracting the data of one channel from the data of another channel. FIG. 7 displays three difference battery response voltage curves, which are the charge voltage deltas between channels. In particular, battery response voltage curve $V_r$ represents the results of subtracting the battery response voltage readings of channel (3) from those of channel (2). Battery response voltage curve Vc represents the results of subtracting the battery response voltage readings of channel (5) from those of channel (1), and battery response voltage curve Vrc represents the results of subtracting the battery response voltage readings of channel (2) from those of channel (1).

Referring back to FIG. 4, application of the waveform continues until the slope of the battery response voltage curve stops increasing at an increasing rate, as indicated at operation 156. As mentioned above, embodiments of the present invention analyze the relationships between the battery response voltages to determine when the battery has reached a battery polarization point wherein the battery has become polarized and thus no longer in need of charging. To determine the battery polarization point, embodiments of the present invention analyze the slopes of the battery response voltage curves. For example, in FIG. 7, the slope 700 of battery response voltage curve $V_r$ at about 33 minutes is increasing at an increasing rate. Then, at about 34 minutes, the slope 700' stops increasing at an increasing rate. It is at this point that application of the waveform is stopped. To increase accuracy, embodiments of the present invention can wait until the slopes of all three battery response voltage curves $V_r$, $V_c$, and $V_{rc}$ stop increasing at an increasing rate.

To determine when the slope of a battery response voltage curve stops increasing at an increasing rate, one embodiment applies Gaussian filters to the data of the battery response voltage curve. In general, trigger peak curves are calculated based on the differences between the Gaussian filtered data, and the waveform is terminated when a maximum peaks occur in the trigger peak curves, as described in detail below.

Figure 8:
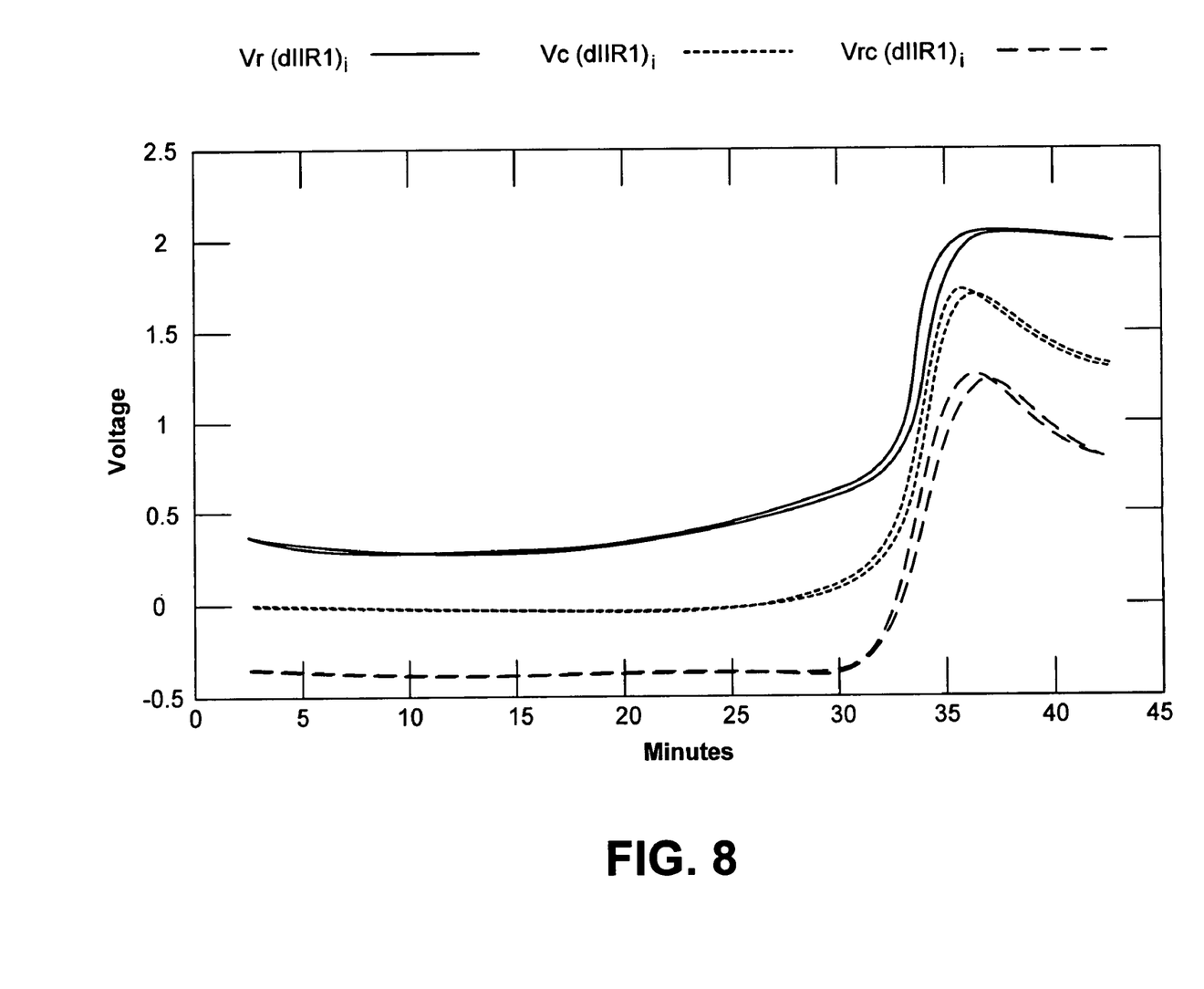
FIG. 8 is illustrative of the application of Gaussian Filters to the data of FIG. 7.
Figure 9:
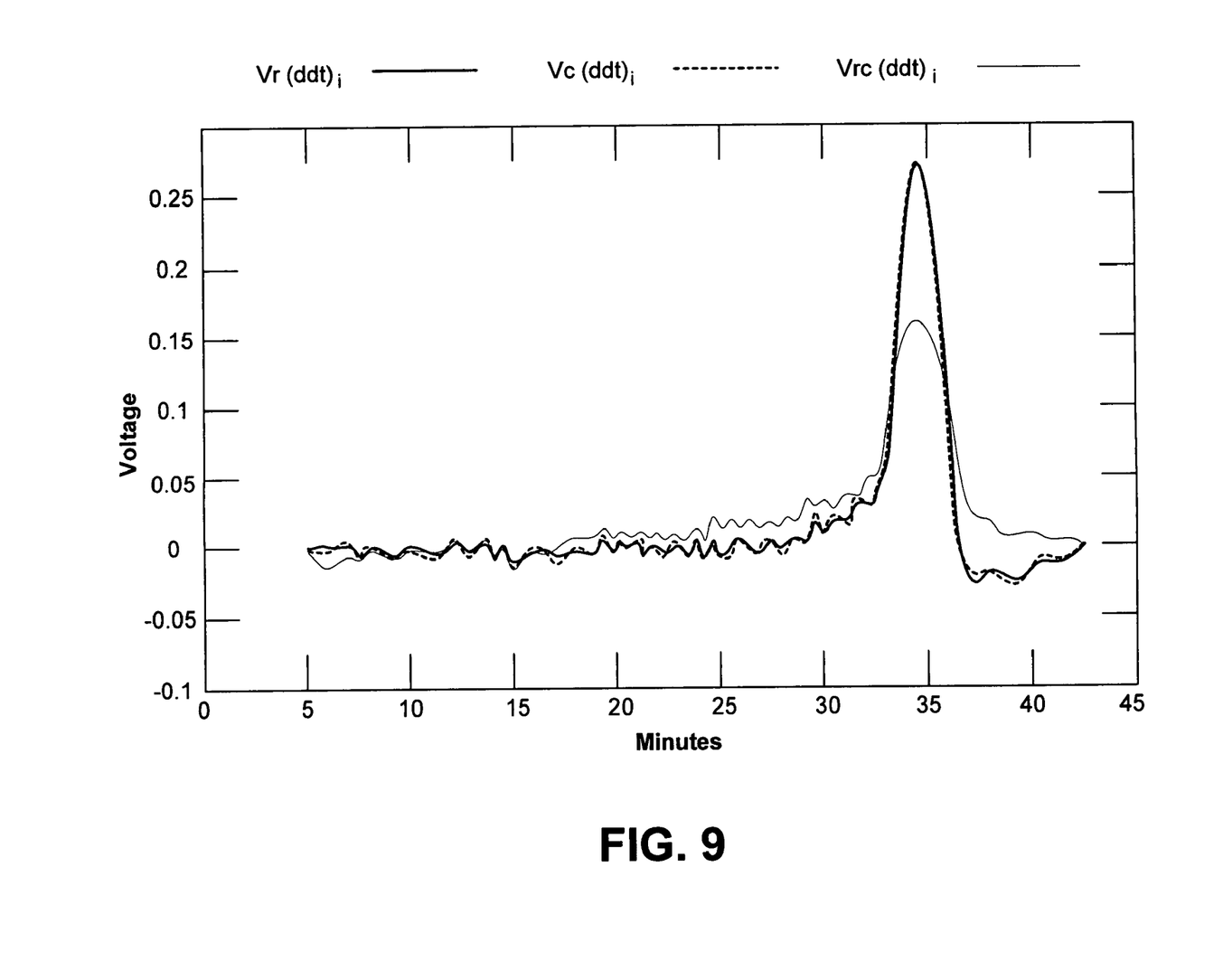
FIG. 9 displays trigger peak curves derived by subtraction of the lesser value curves of $V_r$ (dIIR1), $V_c$ (dIIR1), and $V_{rc}$ (dIIR1) illustrated in FIG. 8.

FIG. 8 illustrates the application of a Gaussian Filter to the data of FIG. 7 to produce a rolling average of real data. A Gaussian Filter is understood to mean a filter having a response curve (magnitude vs. frequency) that approximates an ideal Gaussian curve, that is, a symmetrical curve representing normal distribution, also known as a bell-shaped curve. By way of example, curve $V_r$(dIIR1) comprises two data curves, one resulting from a short filter averaged over five points, and a second resulting from a filter averaged over a larger number of points, e.g. 10 points. As a result of utilization of the filter, the curve $V_r$(dIIR1) is spread apart, as is curve $V_c$(dIIR1) and curve $V_{rc}$(dIIR1). At this point there is another data set derived from a previous set of data: FIG. 9 presenting a third set of data or "second derivative." As used herein "derivative" is understood to mean a data set derived from a previous data set. The second derivative set of data of FIG. 9 represents trigger peak curves based on the differences between the Gaussian filtered data of each curve of FIG. 8.

FIG. 9 illustrates trigger peak curves derived by subtraction of the lesser of the $V_r$(dIIR1), $V_c$(dIIR1), and $V_{rc}$(dIIR1) curves of FIG. 8 from the greater of the $V_r$(dIIR1), $V_r$(dIIR1), and $V_{rc}$(dIIR1) curves of FIG. 8 respectively. In particular, trigger peak curve $V_r$(ddt) is derived by subtracting the lesser of the $V_r$(dIIR1) curves of FIG. 8 from the greater of the $V_r$(dIIR1) curves of FIG. 8. Trigger peak curve $V_c$(ddt) is derived by subtracting the lesser of the $V_c$(dIIR1) curves of FIG. 8 from the greater of the $V_c$(dIIR1) curves of FIG. 8, and trigger peak curve $V_{rc}$(ddt) is derived by subtracting the lesser of the $V_{rc}$(dIIR1) curves of FIG. 8 from the greater of the $V_{rc}$(dIIR1) curves of FIG. 8.

Figure 10:
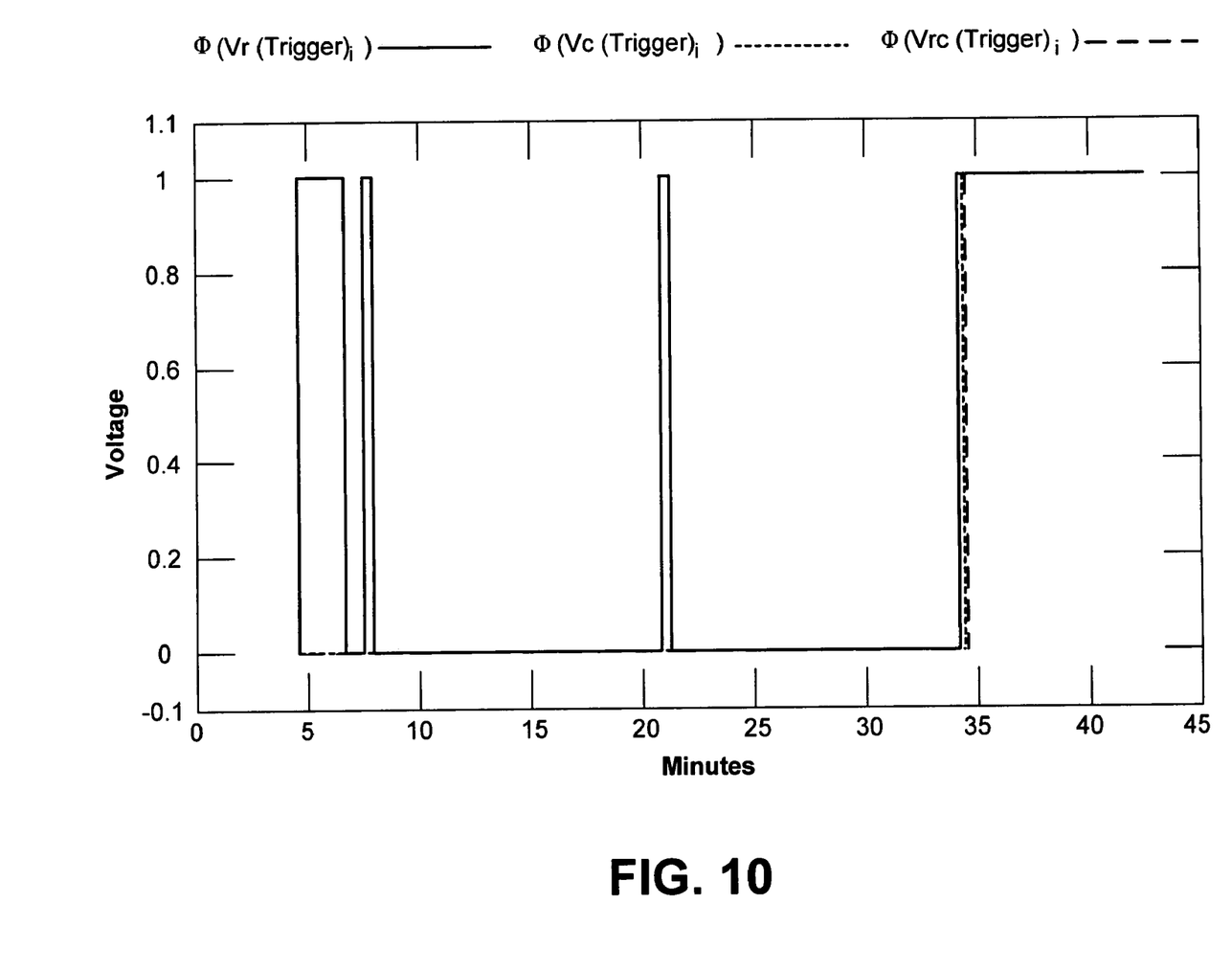
FIG. 10 illustrates the condition where the charge triggers have been initiated.

In the example shown, definitive maximum peaks are shown at about 34 minutes, indicating that the battery has reached a state where a normal charge can be applied. The charging of the battery is terminated when essentially simultaneous maximum peaks occur in the trigger peak curves. As seen in FIG. 10 all three of which charge triggers have to be peaked out at the same time or it is not a "peak," the presence of which is determined by the measured falling off from a maximum value by a predetermined percentage. The fact that, as best shown in FIG. 9, all values, $V_r$(ddt) $V_c$(ddt) and $V_{rc}$(ddt) have reached a peak at about 34 minutes initiates termination of the fast charge, indicating the battery is charged to receive a normal charge, or change in the charging profile initiated.

It is seen, therefore, that the intelligent battery charging system of the present invention generates the following data sets:

1. Actual measurement data (voltages) (FIG. 6);
2. A plurality of sequential measurements of voltage differences derived from the first data set (FIG. 7);
3. A plurality of sequential measurements illustrating the average of said voltage differences derived from said first data set (FIG. 8); and
4. A plurality of curves derived from subtraction of the lesser of the $V_r$, $V_c$, and $V_{rc}$ averages of said voltage differences derived from said first data set from the greater of the $V_r$, $V_c$, and $V_{rc}$ averages of said voltage differences derived from said first set (FIG. 9).

Figure 11:
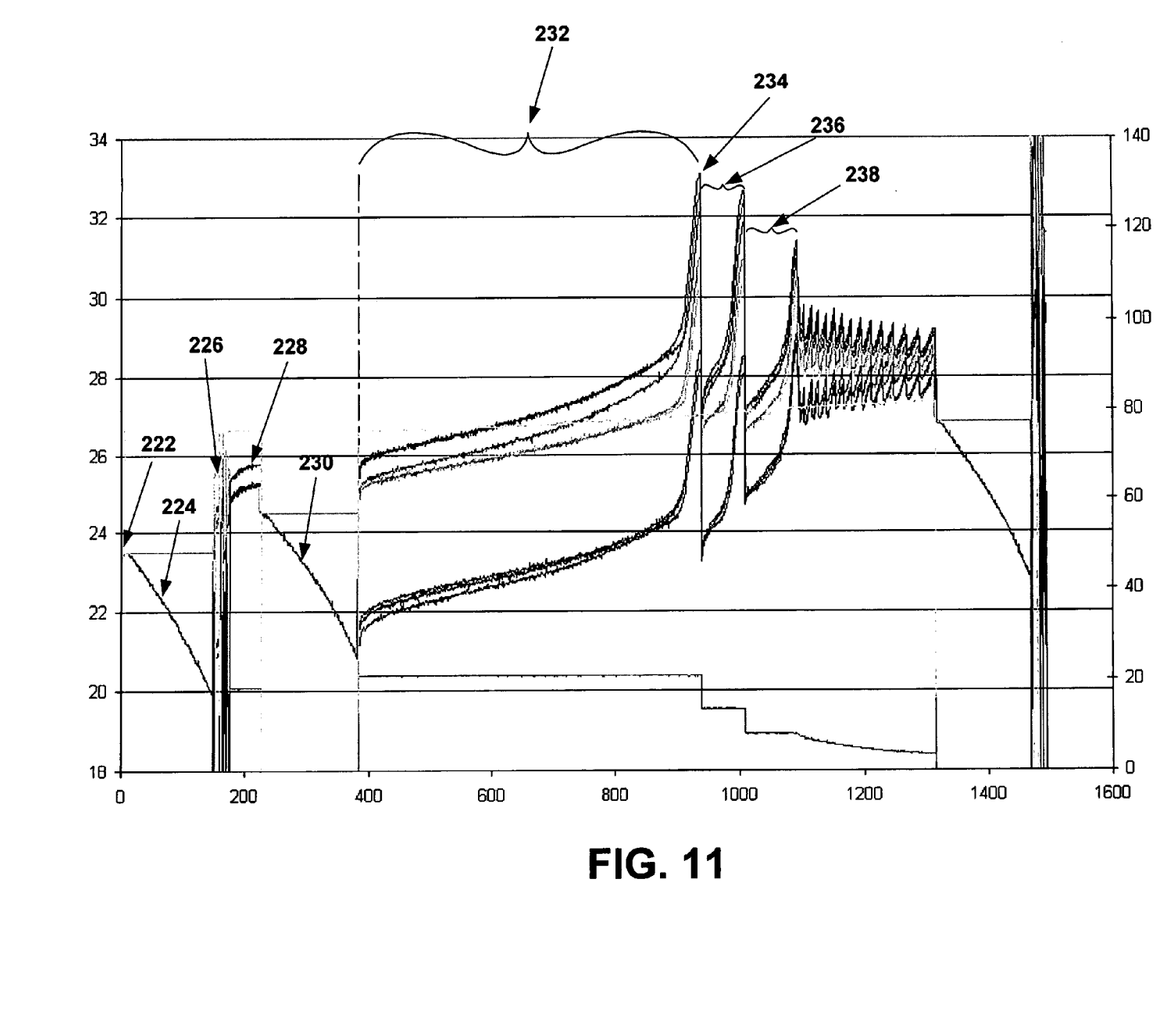
FIG. 11 is a graphic illustration of a typical charge cycle.

The waveforms illustrated in FIG. 11 which, when viewed together with FIG. 3 serve to explain a typical charge cycle. The battery check step 122 is shown by current pulse 222. When it has been determined that a proper connection has been made, the battery is generally sized by measuring the voltage drop 224 under increasing load, thereby setting the level of the charging and depolarizing pulses to be initially deployed, step 124. Thereafter the state of charge (SoC) determination 226 and battery type are determined by provision of a charge at the determined depolarizing and polarizing pulses and thereafter checking the key relationships at the end of the initial charge via the several data collection channels including, but not limited to, a check to determine the presence or absence of key characteristics of lead acid, nickel cadmium ($N_iC_d$), or nickel-metal hydrides batteries, all performed at step 126. Thereafter, at step 128 an initial charge pulse 228, without the application of a depolarizing pulse, is applied to the battery to provide a "quick boost" for redetermination of the depolarizing and charging pulse values.

The values of the depolarizing and charging pulses to be used for the main charge mode are determined using voltage drop 230 under increasing load, step 130, and the main charge sequence commenced, step 132, at a high rate based upon the value of the charging pulse, the depolarizing pulse level being increased proportionately to coincide with the increased fast charge pulse 232. The fast charge continues to be monitored via said data collection channels, the fast charge being terminated when the fast charge trigger 234 waveform reaches a peak value, step 134, the depolarizing and charge levels being reset to normal, and the normal charge commenced with increasing normal charge pulse 236, step 136. The normal charging cycle is subsequently terminated based upon analysis of the derivative waveforms of Channels 1, 2, 3, and 5 monitored by said data collection channels, and a pre end of charge cycle is commenced with increasing pre end of charge pulse 238, thereafter setting the voltage level for the end-of-charge routine step 140. The end-of-charge routine provides a finishing charge, reducing the charging rate over several iterations while keeping the depolarization charge value at normal level, terminating the charging process when the battery is fully charged as indicated by the State of Charge (SoC) routine, Step 142.

The following are exemplary Data Channel relationships that can be utilized in an embodiment of the present invention. They are examples of how the data channels can be utilized as opposed to limiting the scope of the present invention.

At step 126, FIG. 3, State of Charge (SoC) and battery type are checked. SoC is determined by looking at the relationships of several channels, for example:

1. Condition 1—Ch 2/Ch 1 having a value greater than 1.0
2. Condition 2—Ch 3/Ch 5 having a value less than 0.975
3. Condition 3—Ch 7/Ch 8 having a value less than 0.985

In one embodiment, all three conditions should be true.

Also at step 126, the relationship for battery type determination can be, for example:

1. $N_iC_d$ Condition 1—Ch 7/Ch 6 having a value <1.004
2. $N_iC_d$ Condition 2—Ch 8/Ch 7 having a value >0.99

At steps 136 and 138, the following relationships can be utilized to determine battery trigger voltages. In one embodiment, all values should reach maximum levels, which are determined by mathematical equations similar to Gaussian filters.

1. $V_r$—Ch 2 minus Ch 3
2. $V_c$—Ch 5 minus Ch 1
3. $V_{rc}$—Ch 1 minus Ch 2

What has been described in its broadest aspect is a rapid charging battery system wherein a plurality of sequential charging and depolarizing pulses separated by rest periods are impressed upon the terminals of a battery to be charged. A series of voltage measurements at the battery terminals is taken at various points of the sequence, where the measurements together comprise a first data set. A plurality of sequential measurements of the voltage differences are derived from the first data set, and thereafter, a plurality of sequential measurements is made of the averages of the sequential measurements of voltage differences derived from said first data set.

Subsequently, a plurality of values is derived from subtraction of the lesser of the voltage averages of the voltage difference derived from the first data set from the greater of the voltage averages of the voltage averages of the voltage differences derived from the first data. In this manner, key relationships at the end of the sequence determine the level of the subsequent charging cycles and charging cycle termination.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for detecting polarization in a battery, comprising:
   applying a waveform to a battery;
   calculating a battery response voltage curve based on voltage differences between battery response voltage readings corresponding to points along the waveform;
   applying a first Gaussian filter and a second Gaussian filter to data of the battery response voltage curve, wherein the second Gaussian filter averages a greater number of data points than the first Gaussian filter;
   calculating a trigger peak curve based on subtracting results of a first Gaussian filter from results of a second Gaussian filter; and
   identifying a battery polarization point when a maximum peak occurs in the trigger peak curve.

2. A method as recited in claim 1, further comprising the operations of
   calculating a plurality of battery response voltage curves based on voltage differences between battery response voltage readings taken along the waveform; and
   applying the first Gaussian filter and the second Gaussian filter to each battery response voltage curve.

3. A method as recited in claim 2, further comprising the operations of:
   calculating a plurality of trigger peak curves each based on subtracting results of the first Gaussian filter from results of the second Gaussian filter applied to corresponding battery response voltage curves; and
   identifying the battery polarization point when a maximum peak occurs in each trigger peak curve of the plurality of trigger peak curves.

4. A method as recited in claim 1, wherein the waveform comprises an initial rest period, followed by a first charging pulse, followed by a first rest period, followed by a first depolarization pulse, followed by a second rest period, followed by a second charging pulse, followed by a third rest period, followed by a second depolarization pulse.

5. A method as recited in claim 1, wherein the operations of claim 1 occur during a fast charge operation.

6. A method as recited in claim 5, wherein the fast charge operation is followed by a normal charge operation.

7. A method as recited in claim 6, wherein the normal charge operation is followed by a pre end-of-charge operation.

* * * * *

UNITED STATES PATENT AND TRADEMARK OFFICE
CERTIFICATE OF CORRECTION

| | | |
|---|---|---|
| PATENT NO. | : 7,446,509 B2 | Page 1 of 1 |
| APPLICATION NO. | : 11/101049 | |
| DATED | : November 4, 2008 | |
| INVENTOR(S) | : John E. James | |

It is certified that error appears in the above-identified patent and that said Letters Patent is hereby corrected as shown below:

Column 7, line 37, replace the text "Vc" with --$V_c$--.

Column 7, line 40, replace the text "Vrc" with --$V_{rc}$--.

Column 8, line 21, replace the second instance of the text "$V_r$(dIIR1)" with --$V_c$(dIIR1)--.

Signed and Sealed this

Second Day of February, 2010

David J. Kappos
*Director of the United States Patent and Trademark Office*